(12) United States Patent
Kosaki et al.

(10) Patent No.: US 7,432,538 B2
(45) Date of Patent: Oct. 7, 2008

(54) FIELD-EFFECT TRANSISTOR

(75) Inventors: Masayoshi Kosaki, Aichi-ken (JP); Koji Hirata, Aichi-ken (JP)

(73) Assignee: Toyoda Gosei Co., Ltd., Nishikasugai, Aichi-ken (JP)

( * ) Notice: Subject to any disclaimer, the term of this patent is extended or adjusted under 35 U.S.C. 154(b) by 0 days.

(21) Appl. No.: 11/523,095

(22) Filed: Sep. 19, 2006

(65) Prior Publication Data
US 2007/0063220 A1 Mar. 22, 2007

(30) Foreign Application Priority Data
Sep. 22, 2005 (JP) ............................ 2005-275897

(51) Int. Cl.
*H01L 29/778* (2006.01)
(52) U.S. Cl. .................. 257/194; 257/192; 257/195; 257/610; 257/611; 257/612; 257/655; 257/657; 257/E29.246; 257/E29.247; 257/E29.248; 257/E29.249; 257/E29.25; 257/E29.251; 257/E29.252; 257/E21.403
(58) Field of Classification Search ................ 257/194, 257/192, 189, 185, 191, 196, 201
See application file for complete search history.

(56) References Cited
U.S. PATENT DOCUMENTS
5,296,395 A  3/1994  Khan et al.

| | | |
|---|---|---|
| 2004/0195562 A1* | 10/2004 | Munns ........................... 257/1 |
| 2005/0077541 A1* | 4/2005 | Shen et al. .................... 257/194 |
| 2005/0173728 A1* | 8/2005 | Saxler ......................... 257/192 |
| 2006/0255364 A1* | 11/2006 | Saxler et al. .................. 257/192 |

FOREIGN PATENT DOCUMENTS

| | | |
|---|---|---|
| CN | 1599960 | 3/2005 |
| JP | 2000-277536 | 10/2000 |
| JP | 2005-183551 | 7/2005 |
| WO | WO/2003/049193 | 6/2003 |

OTHER PUBLICATIONS

Chinese Office Action dated May 9, 2008 with English translation.

* cited by examiner

*Primary Examiner*—Cuong Q Nguyen
*Assistant Examiner*—Tran Q Tran
(74) *Attorney, Agent, or Firm*—McGinn IP Law Group, PLLC

(57) ABSTRACT

A field-effect transistor includes a channel layer having a channel and a carrier supply layer, disposed on the channel layer, containing a semiconductor represented by the formula $Al_xGa_{1-x}N$, wherein x is greater than 0.04 and less than 0.45. The channel is formed near the interface between the channel layer and the carrier supply layer or depleted, the carrier supply layer has a band gap energy greater than that of the channel layer, and x in the formula $Al_xGa_{1-x}N$ decreases monotonically with an increase in the distance from the interface. The channel layer may be crystalline of gallium nitride. The channel layer may be undoped. X of the formula $Al_xGa_{1-x}N$ of the carrier supply layer is greater than or equal to 0.15 and less than or equal to 0.40 at the interface.

5 Claims, 2 Drawing Sheets

[Fig. 1]
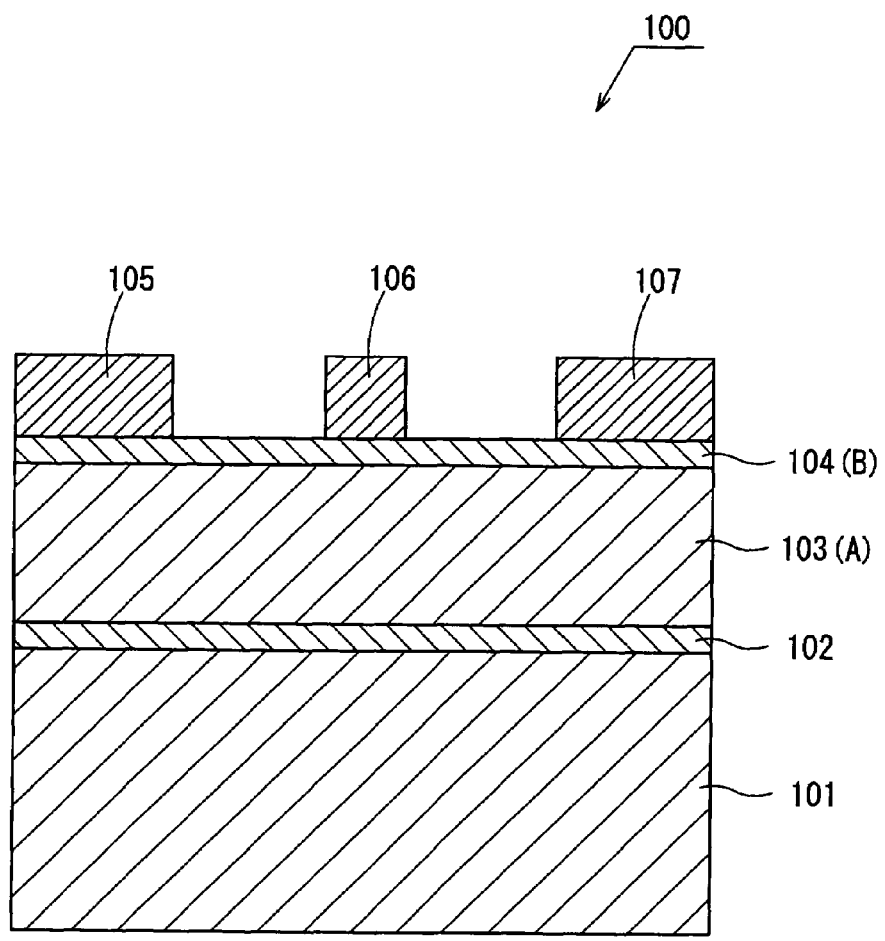

[Fig. 2]
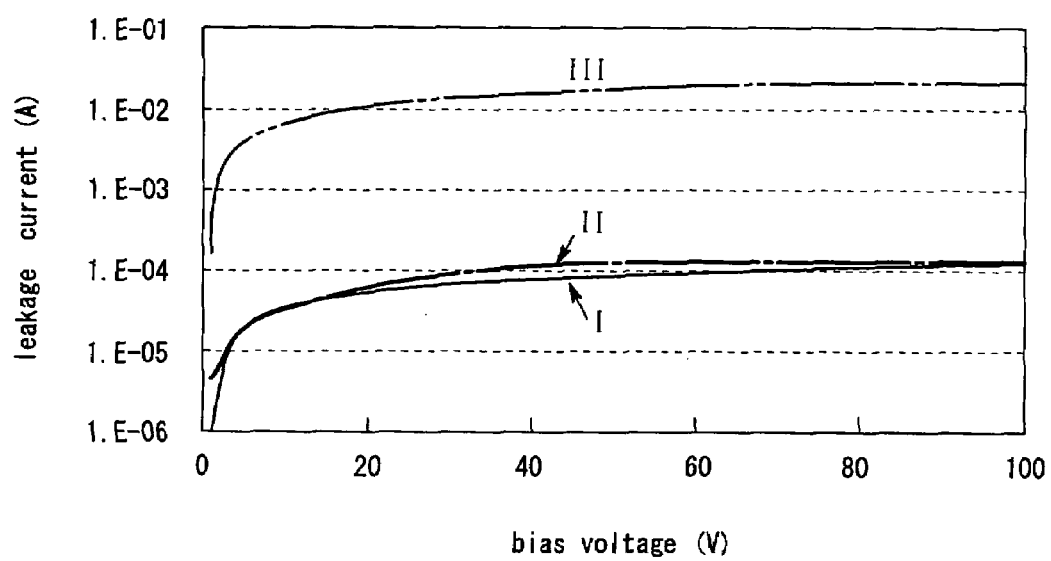

FIELD-EFFECT TRANSISTOR

BACKGROUND OF THE INVENTION

1. Field of the Invention

The present invention relates to field-effect transistors (FETs) such as high-electron-mobility transistors (HEMTs). The present invention particularly relates to a field-effect transistor, manufactured by crystal growth, containing group-III element nitride semiconductors.

2. Description of the Related Art

Conventional field-effect transistors include channel layers and semiconductor crystal layers, such as carrier supply layers or barrier layers, containing a semiconductor represented by the formula $Al_xGa_{1-x}N$. In order to allow the barrier height between each semiconductor crystal layer and channel layer to be high, x in the formula $Al_xGa_{1-x}N$ usually ranges from 0.20 to 0.30. This allows the field-effect transistors to have low on-resistance.

Japanese Unexamined Patent Application Publication Nos. 2000-277536 and 2005-183551 (hereinafter referred to as Patent Documents 1 and 2, respectively) disclose techniques for reducing the leakage currents flowing in the field-effect transistors.

Since the field-effect transistors include the semiconductor crystal layers containing such a semiconductor, the field-effect transistors cannot have high dielectric strength although the field-effect transistors have low on-resistance. This is probably because an increase in x in the formula $Al_xGa_{1-x}N$ deteriorates the crystallinity of the semiconductor crystal layers and therefore leakage paths through which gate leakage currents flow are formed by the application of high voltages to the field-effect transistors.

In the conventional techniques disclosed in Patent Documents 1 and 2, although the leakage currents can be reduced, additional components such as cap layers need to be used. This causes the structures of the field-effect transistors and processes for manufacturing the field-effect transistors to be complicated. Therefore, the conventional techniques are not necessarily advantageous in efficiently manufacturing the field-effect transistors.

SUMMARY OF THE INVENTION

The present invention has been made to solve the above problems. It is an object of the present invention to provide a field-effect transistor having low on-resistance and high dielectric strength.

The above problems can be solved as described below.

The present invention provides a field-effect transistor prepared by forming a plurality of semiconductor crystal layers containing group-III element nitride semiconductors by crystal growth. The field-effect transistor includes a channel layer having a channel and a carrier supply layer, disposed on the channel layer, containing a semiconductor represented by the formula $Al_xGa_{1-x}N$, x being greater than 0.04 and less than 0.45. The channel is formed near the first interface between the channel layer and the carrier supply layer or depleted. The carrier supply layer has a band gap energy greater than that of the channel layer. X in the formula $Al_xGa_{1-x}N$ decreases monotonically with an increase in the distance from the first interface. Alternatively, x in the formula $Al_xGa_{1-x}N$ may decrease stepwise or continuously with an increase in the distance from the first interface or may unintentionally fluctuate slightly. The channel can be formed or depleted by controlling a gate voltage.

In the field-effect transistor, the channel layer may be crystalline such as gallium nitride (GaN), indium gallium nitride (InGaN), or another nitride.

The channel layer may be undoped.

The carrier supply layer may have the first composition ratio x1 at the first interface and x1 in the formula $Al_{x1}Ga_{1-x1}N$ is preferably greater than or equal to 0.15 and less than or equal to 0.40 and more preferably greater than or equal to 0.19 and less than or equal to 0.25.

The carrier supply layer may have the second interface located on the side opposite to the first interface and has the second composition ratio x2 at the second interface and x2 in the formula $Al_{x2}Ga_{1-x2}N$ is preferably greater than or equal to 0.05 and less than or equal to 0.20 and more preferably greater than or equal to 0.13 and less than or equal to 0.17.

Furthermore, x in the formula $Al_xGa_{1-x}N$ of the carrier supply layer may decrease monotonically from 0.20 to 0.15 with an increase in the distance from the first interface to the second interface.

Advantages of the present invention are as described below.

Since x in the formula $Al_xGa_{1-x}N$ of the carrier supply layer decreases monotonically with an increase in the distance from the first interface between the channel layer and the carrier supply layer, the barrier height between the channel layer and the carrier supply layer can be maintained constant and the crystallinity of the channel layer can be maintained high. This allows the field-effect transistor to have low on-resistance and high dielectric strength.

When the channel layer is crystalline of GaN, the channel layer has a good, flat crystal growth face on which the carrier supply layer is formed. This also allows the field-effect transistor to have low on-resistance.

When the channel layer, which is crystalline of GaN, is undoped, the crystal growth face of the channel layer to the carrier supply layer is better and more flat. This also allows the field-effect transistor to have low on-resistance.

When the carrier supply layer has the first composition ratio x1 at the first interface and x1 in the formula $Al_{x1}Ga_{1-x1}N$ is greater than or equal to 0.15 and less than or equal to 0.40, the barrier height between the channel layer and the carrier supply layer is high. This also allows the field-effect transistor to have low on-resistance.

When the carrier supply layer has the second interface located on the side opposite to the first interface and has the second composition ratio x2 at the second interface to e.g., an electrode and x2 in the formula $Al_{x2}Ga_{1-x2}N$ is greater than or equal to 0.05 and less than or equal to 0.20, the crystallinity of the carrier supply layer is high. This reduces the leakage current flowing in the field-effect transistor.

When x in the formula $Al_xGa_{1-x}N$ of the carrier supply layer decreases monotonically from 0.20 to 0.15 with an increase in the distance from the first interface, the barrier height between the channel layer and the carrier supply layer is high and the crystallinity of the carrier supply layer is high. This allows the field-effect transistor to have low on-resistance and reduces the leakage current flowing in the field-effect transistor.

BRIEF DESCRIPTION OF THE DRAWINGS

FIG. 1 is a sectional view of a field-effect transistor 100 according to an embodiment of the present invention; and FIG. 2 is a graph showing the relationship between the bias voltage applied to each sample and the corresponding leakage current.

DESCRIPTION OF THE PREFERRED EMBODIMENT

An embodiment of the present invention will now be described. The embodiment should not, in any way, be construed as limitative.

FIG. 1 shows a field-effect transistor 100 according to the embodiment. The field-effect transistor 100 is a semiconductor device prepared by depositing group-III element nitride based semiconductors. With reference to FIG. 1, the field-effect transistor 100 includes a crystal growth substrate 101, a buffer layer 102, an undoped first semiconductor crystal layer 103 serving as a channel layer, and an undoped second semiconductor crystal layer 104 serving as a carrier supply layer, these layers being arranged on the crystal growth substrate 101 in that order.

The crystal growth substrate 101 has a thickness of about 400 μm and contains silicon carbide (SiC). The buffer layer 102 has a thickness of about 200 nm and contains aluminum nitride (AlN).

The first semiconductor crystal layer 103 has a thickness of about 2 μm and contains undoped GaN. The second semiconductor crystal layer 104 has a thickness of about 400 Å and contains a semiconductor represented by the formula $Al_xGa_{1-x}N$, wherein $0.15 \leq x \leq 0.20$. X in the formula $Al_xGa_{1-x}N$ decreases monotonically from 0.20 to 0.15 with an increase in the distance from the first interface between the first and second semiconductor crystal layers 103 and 104. The second semiconductor crystal layer 104 has a multi-layer structure, for example, a six-layer structure.

The thickness of the second semiconductor crystal layer 104 is designed to allow carriers (electrons) to tunnel from ohmic electrodes described below to a channel layer, the channel layer being formed near the first interface between the first and second semiconductor crystal layers 103 and 104 when a gate is turned on. The second interface of the carrier supply layer is between the carrier supply layer and the electrodes.

The field-effect transistor 100 further includes a source electrode 105 that is ohmic, a gate electrode 106 that is a Schottky type, and a drain electrode 107 that is ohmic, these electrodes being arranged on the second semiconductor crystal layer 104. The source and drain electrodes 105 and 107 each include a first metal layer formed by vapor deposition and a second metal layer, formed by vapor deposition, lying on the first metal layer. The first metal layer contains titanium (Ti) and has a thickness of about 100 Å. The second metal layer contains Al and has a thickness of about 3,000 Å. The source and drain electrodes 105 and 107 are securely bonded to or alloyed with the second semiconductor crystal layer 104 in such a manner that the source and drain electrodes 105 and 107 are heat-treated at a temperature of about 700° C. to 900° C. for less than one second by flash annealing. The gate electrode 106 includes a third metal layer formed by vapor deposition and a fourth metal layer, formed by vapor deposition, lying on the third metal layer. The third metal layer contains nickel (Ni) and has a thickness of about 100 Å. The fourth metal layer contains gold (Au) and has a thickness of about 3,000 Å.

A method for manufacturing the field-effect transistor 100 will now be described with emphasis on the second semiconductor crystal layer 104 that is a key component of the field-effect transistor 100.

The buffer layer 102 and the first and second semiconductor crystal layers 103 and 104 are preferably formed by a vapor-phase growth technique such as metal-organic vapor phase epitaxy (MOVPE). Gaseous substances used to form these layers are gaseous hydrogen ($H_2$) or nitrogen ($N_2$) used as a carrier gas, gaseous ammonia ($NH_3$), gaseous trimethyl gallium ($Ga(CH_3)_3$), gaseous trimethyl aluminum ($Al(CH_3)_3$), and the like.

Examples of a technique for forming these layers include molecular beam epitaxy (MBE) and halide vapor phase epitaxy (HVPE) in addition to MOVPE.

Conditions for forming these layers are as described below.

1. Buffer Layer 102

(1) Crystal Growth Temperature $T_O$: 1,140° C.

(2) Layer Structure: Single-Layer Structure (about 200 nm thickness, AlN)

2. First Semiconductor Crystal Layer 103

(1) Crystal Growth Temperature $T_A$: 1,140° C.

(2) Layer Structure: Single-Layer Structure (about 2 μm thickness, GaN)

3. Second Semiconductor Crystal Layer 104

(1) Crystal Growth Temperature $T_B$: 1,000° C.

(2) Layer Structure: Multi-Layer Structure (Six-Layer Structure)

First Sublayer: about 70 Å thickness, x in the formula $Al_xGa_{1-x}N$ being equal to 0.20

Second Sublayer: about 70 Å thickness, x in the formula $Al_xGa_{1-x}N$ being equal to 0.19

Third Sublayer: about 60 Å thickness, x in the formula $Al_xGa_{1-x}N$ being equal to 0.18

Fourth Sublayer: about 60 Å thickness, x in the formula $Al_xGa_{1-x}N$ being equal to 0.17

Fifth Sublayer: about 70 Å thickness, x in the formula $Al_xGa_{1-x}N$ being equal to 0.16

Sixth Sublayer: about 70 Å thickness, x in the formula $Al_xGa_{1-x}N$ being equal to 0.15

In this case the first composition ratio x1 of the second semiconductor layer 104 is 0.20 and the second composition ratio x2 of that is 0.15.

The second semiconductor crystal layer 104 can be formed so as to have such a six-layer structure in such a manner that the content of $Al(CH_3)_3$ in feed gas is slightly varied during the formation of the first to sixth sublayers by crystal growth i.e., from the first to second interface of the second semiconductor layer 104. Therefore, the field-effect transistor 100 can be manufactured with efficiency higher than or equal to the manufacturing efficiency of conventional field-effect transistors.

EXAMPLES

Example 1

Sample S1 having the same configuration as that of the field-effect transistor 100 shown in FIG. 1 was prepared.

Example 2

Sample S2 was prepared. Sample S2 had substantially the same configuration as that of the field-effect transistor 100 shown in FIG. 1 except that Sample S2 included a second semiconductor crystal layer which contained a semiconductor represented by the formula $Al_{0.15}Ga_{0.85}N$ and which had a single-layer structure.

Comparative Example 1

Sample S3 similar to the field-effect transistor 100 shown in FIG. 1 was prepared. Sample S3 was different from the field-effect transistor 100 in that Sample S3 included a second semiconductor crystal layer which contained a semiconductor represented by the formula $Al_{0.20}Ga_{0.80}N$ and which had a single-layer structure. Other components included in Sample S3 were the same as those of field-effect transistor 100.

Experiment 1

Samples S1 to S3 were measured for leakage current.

FIG. 2 shows the relationship between the bias voltage applied to each sample and the corresponding leakage current. In FIG. 2, curves I, II, and III represent the changes in the leakage currents flowing in Samples S1, S2, and S3, respectively.

As is clear from FIG. 2, the leakage current flowing in Sample S1 is substantially the same as that flowing in Sample S2 and is 1/100 or less of that flowing in Sample S3.

Experiment 2

Samples S1 to S3 were checked in such a manner that the sheet resistance of the interface between the first and second semiconductor crystal layers of each sample was measured. The measurement showed that Sample S1 had a sheet resistance of about 600 Ω/square, Sample S2 had a sheet resistance of about 700 Ω/square, and Sample S3 had a sheet resistance of about 500 Ω/square.

Sample S1 has low sheet resistance, this is, low on-resistance and therefore has high electrical conductivity. Furthermore, the leakage current flowing in Sample S1 is small and therefore Sample S1 has high dielectric strength as described in Experiment 1. That is, the electrical conductivity and dielectric strength of Sample S1 are compatible with each other. A field-effect transistor having such properties cannot be readily manufactured by any conventional technique.

As described above, the present invention provides a field-effect transistor, having low on-resistance and high dielectric strength, such as HEMT. The field-effect transistor can be manufactured by the crystal growth of group-III element nitride based semiconductors.

What is claimed is:

1. A field-effect transistor prepared by forming a plurality of semiconductor crystal layers containing group-III element nitride based semiconductors by crystal growth, the field-effect transistor comprising:

a channel layer having a channel;

a carrier supply layer, disposed on the channel layer, containing a semiconductor represented by the formula $Al_xGa_{1-x}N$; and a source electrode, a gate electrode and a drain electrode which are formed on said carrier supply layer, wherein the channel is formed near a first interface between the channel layer and the carrier supply layer or depleted, the carrier supply layer has a band gap energy greater than that of the channel layer, x in the formula $Al_xGa_{1-x}N$ decreases monotonically at least one of stepwise and continuously with an increase in the distance from said first interface, said carrier supply layer has a first composition ratio x1 at said first interface and x1 in the formula $Al_{x1}Ga_{1-x1}N$ is greater than or equal to 0.15 and less than or equal to 0.40 and said carrier supply layer has a second interface located on the side opposite to said first interface and has a second composition ratio x2 at said second interface and x2 in the formula $Al_{x2}Ga_{1-x2}N$ is greater than or equal to 0.05 and less than or equal to 0.20.

2. The field-effect transistor according to claim 1, wherein the channel layer is crystalline of gallium nitride.

3. The field-effect transistor according to claim 2, wherein the channel layer is undoped.

4. The field-effect transistor according to claim 1, wherein x in the formula $Al_xGa_{1-x}N$ decreases monotonically from 0.20 to 0.15 with an increase in the distance from the first interface.

5. The field-effect transistor according to claim 1, wherein said supply layer is undoped.

\* \* \* \* \*